(12) United States Patent
Roberg

(10) Patent No.: US 10,122,333 B2
(45) Date of Patent: Nov. 6, 2018

(54) AUTO-BIAS CIRCUIT FOR STACKED FET POWER AMPLIFIER

(71) Applicant: Qorvo US, Inc., Greensboro, NC (US)

(72) Inventor: Michael Roberg, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/427,651

(22) Filed: Feb. 8, 2017

(65) Prior Publication Data

US 2017/0230015 A1    Aug. 10, 2017

Related U.S. Application Data

(60) Provisional application No. 62/292,504, filed on Feb. 8, 2016.

(51) Int. Cl.
| | |
|---|---|
| *H03F 3/21* | (2006.01) |
| *H03G 3/30* | (2006.01) |
| *H03F 1/22* | (2006.01) |

(52) U.S. Cl.
CPC ........... *H03F 3/21* (2013.01); *H03F 2200/18* (2013.01)

(58) Field of Classification Search
USPC .......................... 330/285, 296, 311, 277, 290
See application file for complete search history.

(56) References Cited

U.S. PATENT DOCUMENTS 8,111,104 B2 *  2/2012  Ahadian ................. H03F 1/301
                                                            330/290

OTHER PUBLICATIONS

Dabag, Hayg-Taniel et al., "Analysis and Design of Stacked-FET Millimeter-Wave Power Amplifiers," IEEE Transactions on Microwave Theory and Techniques, vol. 61, No. 4, Apr. 2013, pp. 1543-1556.

Kim, Youngmin et al., "Analysis and Design of Millimeter-Wave Power Amplifier Using Stacked-FET Structure," IEEE Transactions on Microwave Theory and Techniques, vol. 63, No. 2, Feb. 2015, pp. 691-702.

* cited by examiner

*Primary Examiner* — Hieu Nguyen
(74) *Attorney, Agent, or Firm* — Withrow & Terranova, P.L.L.C.

(57) ABSTRACT

The present disclosure relates to circuitry including an auto-bias circuit for a stacked FET power amplifier. The auto-bias circuit includes a dividing circuit and an averaging circuit. The dividing circuit is configured to receive a control signal with a control voltage and provide a first pre-gate signal having a first pre-gate voltage that corresponds to a fraction of the control voltage. The averaging circuit is configured to receive the control signal and a supply signal with a supply voltage and provide a second pre-gate signal having a second pre-gate voltage that corresponds to a fraction of a sum of the control voltage and the supply voltage. The stacked power amplifier includes a first FET in series with a second FET. The first FET receives a first gate signal derived from the first pre-gate signal. The second FET receives a second gate signal derived from the second pre-gate signal.

22 Claims, 5 Drawing Sheets

AUTO-BIAS CIRCUIT FOR STACKED FET POWER AMPLIFIER

RELATED APPLICATIONS

This application claims the benefit of provisional patent application Ser. No. 62/292,504, filed Feb. 8, 2016 the disclosure of which is hereby incorporated herein by reference in its entirety.

FIELD OF THE DISCLOSURE

The present disclosure relates to the field of amplifier biasing, and more particularly to circuitry including an auto-bias circuit for a stacked field-effect transistor (FET) power amplifier.

BACKGROUND

Complementary metal-oxide-semiconductor (CMOS) technologies have traditionally not been favored for power amplifier applications, because of the inability of field-effect transistors (FETs) to tolerate high voltage levels. Thus, the power provided by a single FET is limited. In recent decades, stacked FETs (coupled in series) have been introduced to overcome the limited CMOS voltage range and applied in power amplifier applications.

Figure 1:
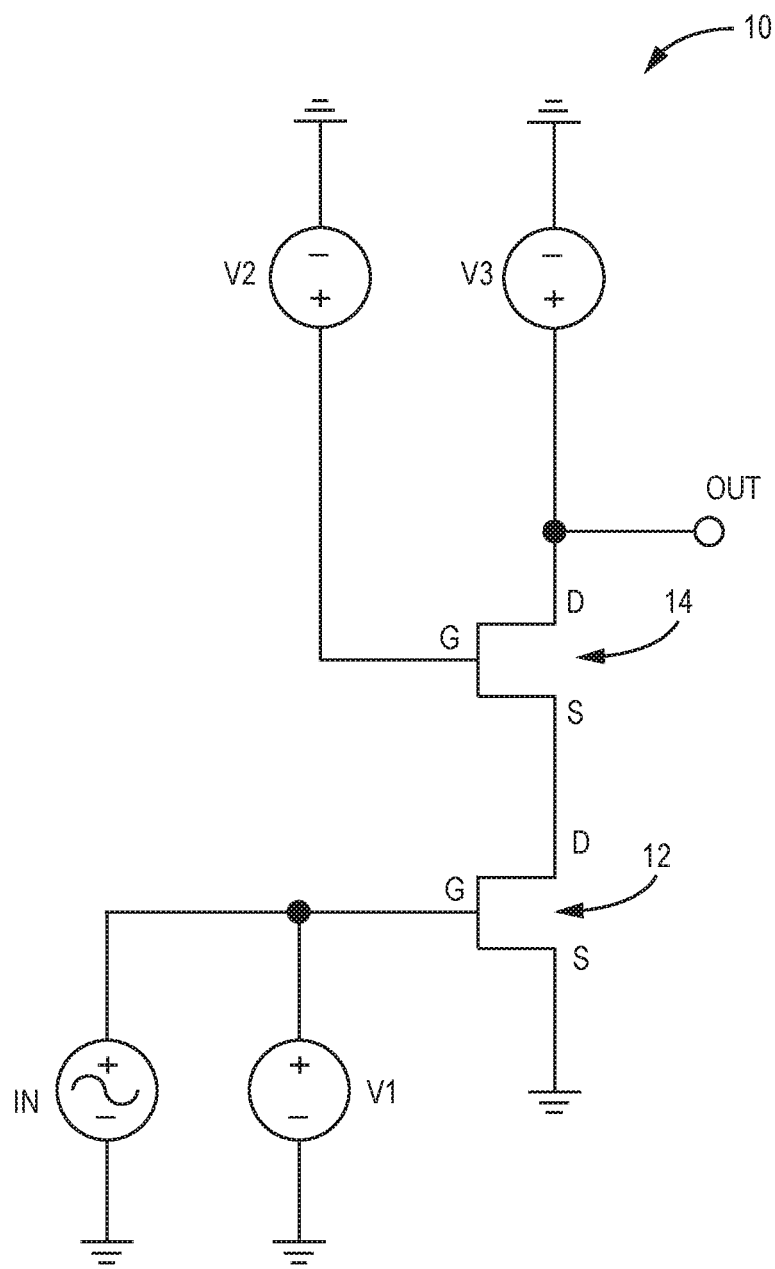

In order to get efficient performance, a superior gain, and output power, a conventional stacked FET power amplifier needs at least three individual voltage supplies to meet gate voltage and drain voltage requirements. As shown in FIG. 1, an exemplary stacked FET power amplifier 10 is coupled to individual voltage supplies V1, V2, and V3, and an input signal IN. The stacked FET power amplifier 10 includes a first FET 12 stacked, or coupled in series, with a second FET 14. A gate of the first FET 12 is coupled to V1 and the signal supply IN, a source of the first FET 12 is coupled to ground, and a drain of the first FET 12 is coupled to a source of the second FET 14. A gate of the second FET 14 is coupled to V2, and a drain of the second FET 14 is coupled to V3. An output signal OUT is provided at the drain of the second FET 14 and is an amplified version of the input signal IN.

V1 is set to the voltage required for desired current density, typically near −3V for a Gallium Nitride (GaN) FET. V3 is set to twice the signal FET drain voltage that users desire to bias the FET (e.g. 40V for a 20V process). Ideally, V2 is set to 0.5V3+V1 to ensure neither the first FET 12 nor the second FET 14 experiences compression or breakdown before the other. Deviation of V2 from the ideal voltage will alter voltage at the drain of the first FET 12 (the source of the second FET 14) and create non-ideal and different drain to source voltages for the first and second FETs 12 and 14. Therefore, the first FET 12 or the second FET 14 may experience compression or breakdown before the other. Further, the more individual voltage supplies required by a circuitry, the more area that is needed for the circuitry, which increase cost.

Accordingly, there remains a need to use fewer individual voltage supplies to provide gate/drain biasing to a stacked FET power amplifier.

SUMMARY

The present disclosure relates to circuitry including an auto-bias circuit for a stacked field-effect transistor (FET) power amplifier. The disclosed circuitry includes a supply node, a control node, an input node, an output node, a fixed voltage node, an auto-bias circuit, a stacked power amplifier, a first conditioning circuit, and a second conditioning circuit. The auto-bias circuit includes a dividing circuit and an averaging circuit. Herein, the dividing circuit is coupled between the control node and the fixed voltage node, and configured to provide a first pre-gate signal having a first pre-gate voltage that corresponds to a fraction of a control voltage of a control signal applied at the control node. The averaging circuit is coupled between the supply node and the control node, and configured to provide a second pre-gate signal having a second pre-gate voltage that corresponds to a fraction of a sum of the control voltage and a supply voltage of a supply signal provided at the supply node. The stacked power amplifier is coupled between the supply node and the fixed voltage node, and includes a first FET coupled in series with a second FET. A drain of the first FET is coupled to a source of the second FET. The first conditioning circuit is configured to receive the first pre-gate signal and provide a first gate signal to a gate of the first FET. The second conditioning circuit is configured to receive the second pre-gate signal and provide a second gate signal to a gate of the second FET. Herein, an input signal that is from the input node and provided to at least one of the first conditioning circuit and the second conditioning circuit causes an output signal at the output node that is coupled to a drain of the second FET.

In one embodiment of the circuitry, a drain signal that is provided at the drain of the second FET, the first gate signal, and the second gate signal are derived from at least one of only the supply signal, the control signal, and the input signal.

In one embodiment of the circuitry, the first and second FETs are gallium nitride (GaN) FETs.

In one embodiment of the circuitry, the averaging circuit includes a first averaging resistor coupled in series with a second averaging resistor. A value of the first averaging resistor is within 2% of a value of the second averaging resistor.

In one embodiment of the circuitry, the dividing circuit includes a first dividing resistor coupled in series with a second dividing resistor. A value of the first dividing resistor is within 2% of a value of the second dividing resistor.

In one embodiment of the circuitry, the first conditioning circuit and the second conditioning circuit are powered by the supply signal.

In one embodiment of the circuitry, first gate current provided by the first gate signal to the gate of the first FET is sourced by the supply signal and not the control signal, and second gate current provided by the second gate signal to the gate of the second FET is sourced by the supply signal and not the control signal.

In one embodiment of the circuitry, the first conditioning circuit includes a bias circuit configured to combine the first pre-gate signal and the input signal, and provide the first gate signal to the gate of the first FET. The bias circuit includes a capacitor and an inductor, where the capacitor is coupled between the gate of the first FET and the input node and the inductor is coupled between the gate of the first FET and the dividing circuit.

In one embodiment of the circuitry, the first conditioning circuit includes a first shifting-buffer circuit and a bias circuit. Herein, the first shifting-buffer circuit includes a first level shifter and a first voltage buffer. The first level shifter is configured to receive the first pre-gate signal, reduce the first pre-gate voltage, and provide a first shifted pre-gate signal. The first voltage buffer is configured to receive the first shifted pre-gate signal and provide a first buffered pre-gate signal. Herein, the first voltage buffer causes first gate current provided by the first gate signal to be sourced by the supply signal and not the control signal. The bias circuit is configured to combine the first buffered pre-gate signal and the input signal, and provide the first gate signal to the gate of the first FET.

In one embodiment of the circuitry, the first conditioning circuit further includes a second shifting-buffer circuit coupled between the supply node and the first shifting-buffer circuit and configured to provide power to the first voltage buffer.

In one embodiment of the circuitry, the second conditioning circuit includes a bias circuit configured to receive the second pre-gate signal and provide the second gate signal to the gate of the second FET. Herein, the bias circuit comprises a capacitor and an inductor. The capacitor is coupled between the gate of the second FET and the fixed voltage node. The inductor is coupled between the gate of the second FET and the averaging circuit.

In one embodiment of the circuitry, the second conditioning circuit includes a shifting-buffer circuit and a bias circuit. Herein, the shifting-buffer circuit includes a level shifter and a voltage buffer. The level shifter is configured to receive the second pre-gate signal, reduce the second pre-gate voltage, and provide a second shifted pre-gate signal. The voltage buffer is configured to receive the second shifted pre-gate signal and provide a second buffered pre-gate signal. Herein, the voltage buffer causes gate current provided by the second gate signal to be sourced by the supply signal and not the control signal. The bias circuit is configured to receive the second buffered pre-gate signal and provide the second gate signal to the gate of the second FET.

According to another embodiment, the circuitry further includes a bias circuit coupled between the supply node and the drain of the second FET and configured to receive a drain signal provided at the drain of the second FET and provide the output signal to the output node. Herein, the bias circuit includes a capacitor and an inductor. The capacitor is coupled between the drain of the second FET and the output node. The inductor is coupled between the drain of the second FET and the supply node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a stacked field-effect transistor (FET) power amplifier with individual power supplies.

Figure 2:
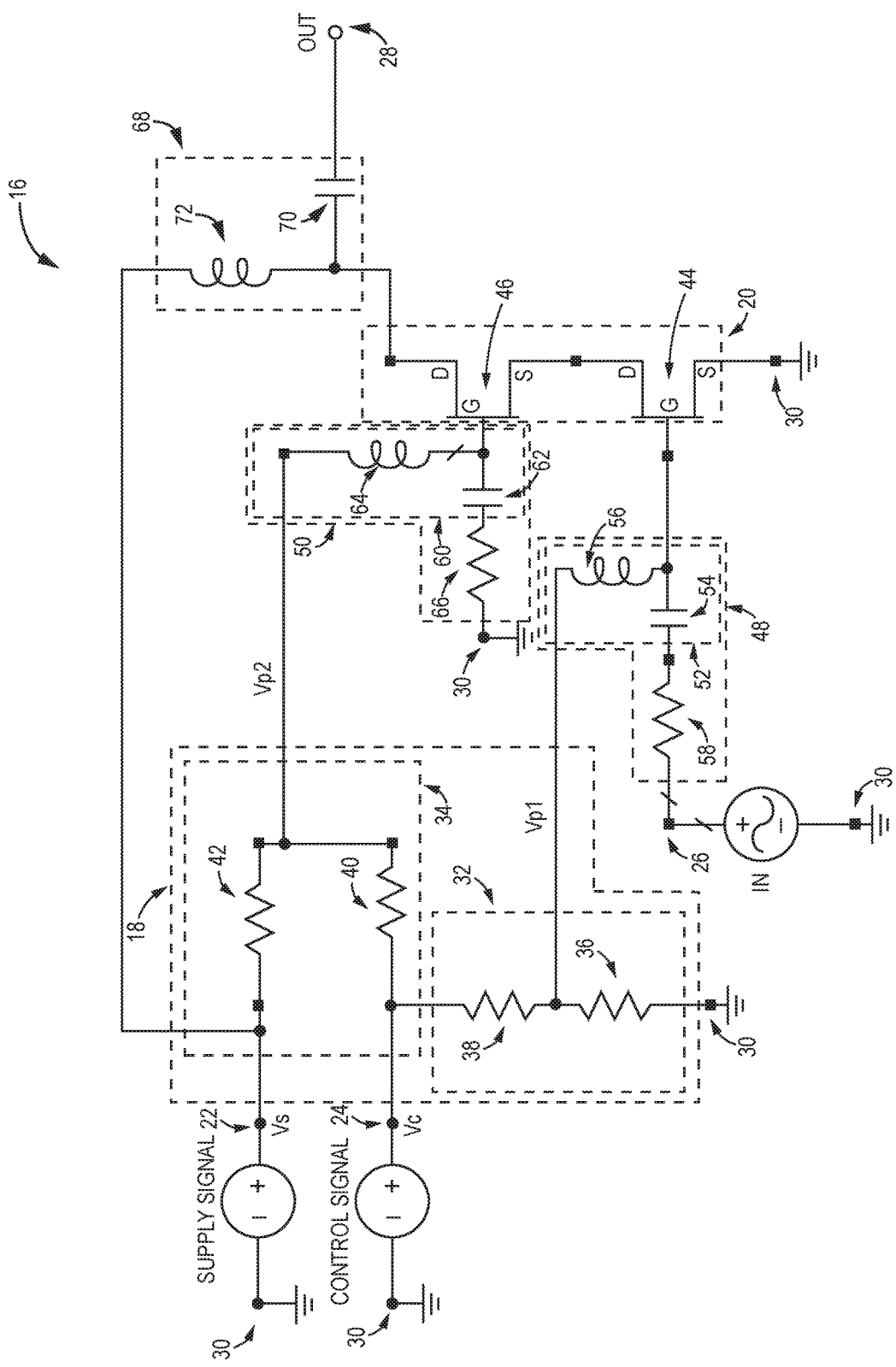

FIG. 2 provides an exemplary circuitry including an auto-bias circuit for a stacked FET power amplifier according to one embodiment of the present disclosure.

Figure 3:
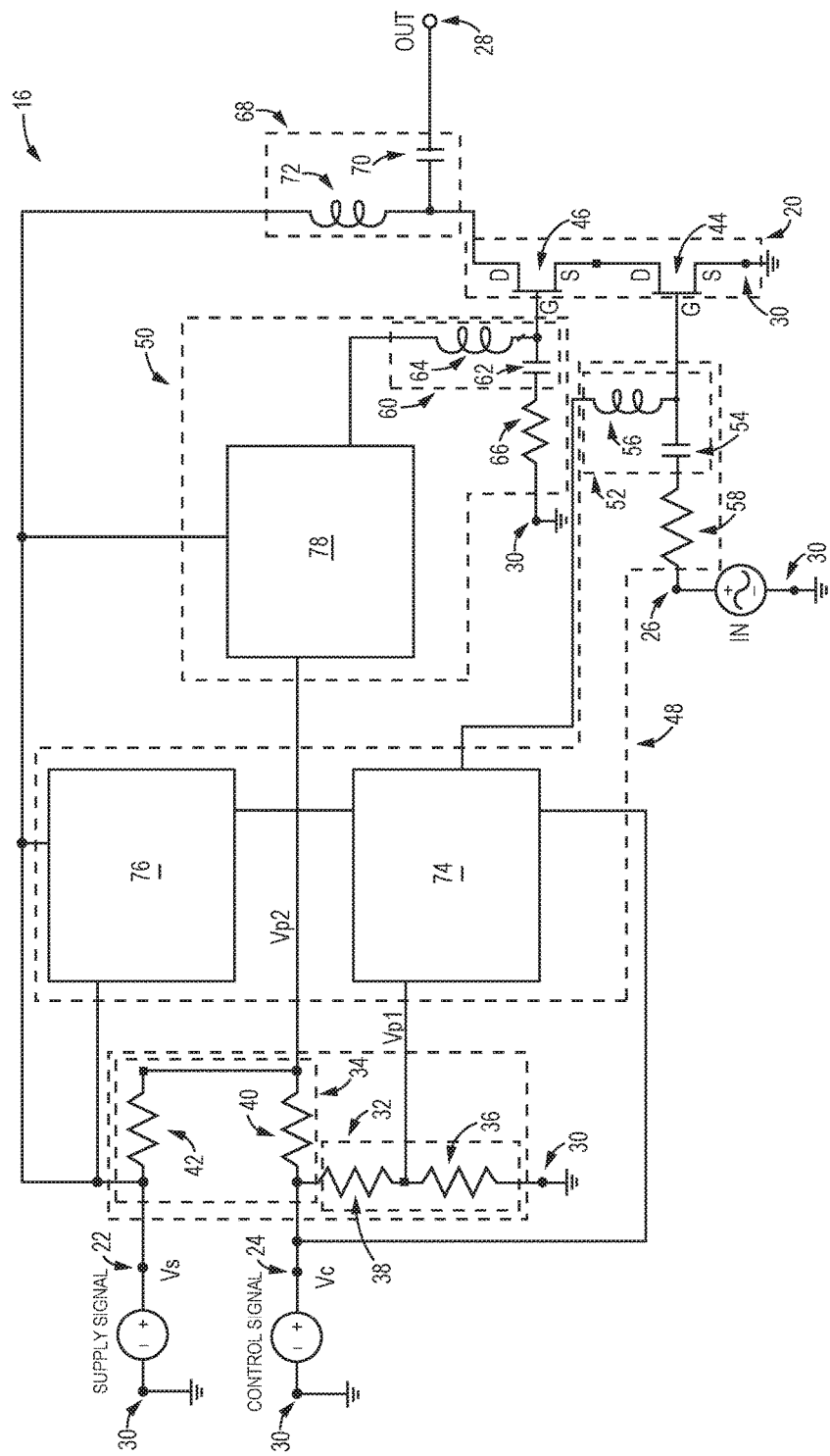

FIG. 3 provides an alternative circuitry including an auto-bias circuit for a stacked FET power amplifier according to one embodiment of the present disclosure.

Figure 4:
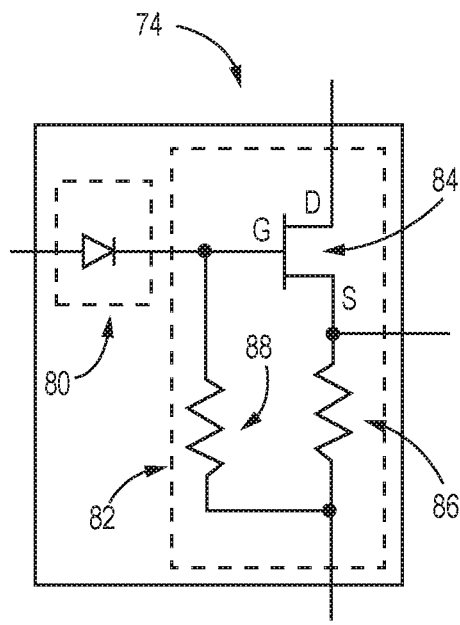
Figure 5:
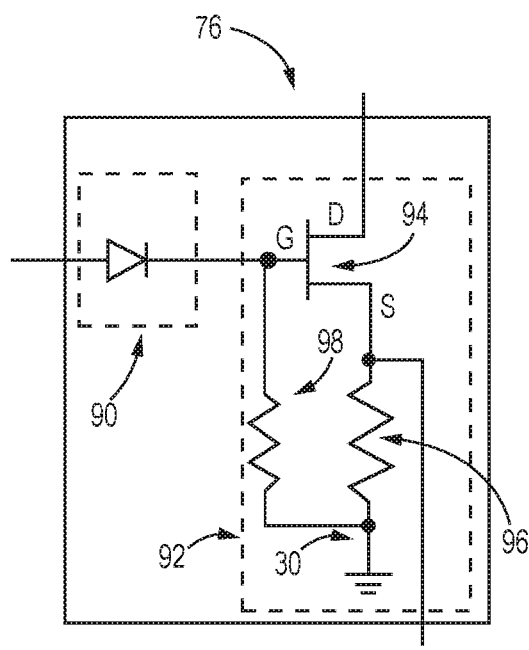
Figure 6:
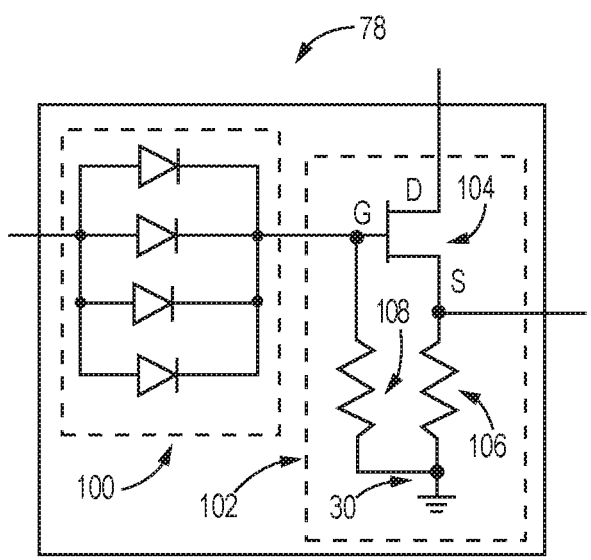

FIGS. 4-6 provide exemplary shifting-buffer circuits used in the alternative circuitry shown in FIG. 3.

It will be understood that for clear illustrations, FIGS. 1-6 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 2 provides an exemplary circuitry 16 including an auto-bias circuit 18 for a stacked FET power amplifier 20 according to one embodiment of the present disclosure. The circuitry 16 includes a supply node 22, a control node 24, an input node 26, an output node 28, and a fixed voltage node 30. In this embodiment, the fixed voltage node 30 is connected to the ground. In different applications, the fixed voltage node 30 may have another fixed value other than the ground.

The auto-bias circuit 18 includes a dividing circuit 32 and an averaging circuit 34. Herein, the dividing circuit 32 is coupled between the control node 24 and the fixed voltage node 30, and the averaging circuit 34 is coupled between the supply node 22 and the control node 24. The dividing circuit 32 is configured to provide a first pre-gate signal having a first pre-gate voltage $V_{P1}$ that corresponds to a fraction of a control voltage $V_C$ of a control signal applied at the control node 24. In this embodiment, the dividing circuit 32 includes a first dividing resistor 36 coupled in series with a second dividing resistor 38. The first pre-gate signal is provided from the joint point of the first and second dividing resistors 36 and 38. A value of the first dividing resistor 36 is within 2% of a value of the second dividing resistor 38. Therefore, $V_{P1}$ is approximately equal to ½ $V_C$. In different applications, the relative values of the first and second dividing resistors 36 and 38 may be different.

The averaging circuit 34 is configured to provide a second pre-gate signal having a second pre-gate voltage $V_{P2}$ that corresponds to a fraction of a sum of the control voltage $V_C$ and a supply voltage $V_S$ of a supply signal provided at the supply node 22. The supply signal has a much larger value than the control signal. In this embodiment, the averaging circuit 34 includes a first averaging resistor 40 coupled in series with a second averaging resistor 42. The second pre-gate signal is provided from the joint point of the first and second averaging resistors 40 and 42. A value of the first averaging resistor 40 is within 2% of a value of the second averaging resistor 42. Therefore, $V_{P2}$ is approximately equal to ½ ($V_C$+$V_S$). Consequently, $V_{P2}$ is approximately equal to $V_{P1}$+½$V_S$. The second pre-gate voltage $V_{P2}$ will automatically bias with the first pre-gate voltage $V_{P1}$. In different applications, the relative values of the first and second averaging resistors 40 and 42 may be different, and the first pre-gate voltage $V_{P1}$ and the second pre-gate voltage $V_{P2}$ may have other auto-biased relationships.

The stacked power amplifier 20 is coupled between the supply node 22 and the fixed voltage node 30, and includes a first FET 44 coupled in series with a second FET 46. A source of the first FET 44 is coupled to the fixed voltage node 30, a drain of the first FET 44 is coupled to a source of the second FET 46, and a drain of the second FET 46 is coupled to the supply node 22 (may not be directly coupled). In this embodiment, the first and second FETs 44 and 46 may be gallium nitride (GaN) FETs, but FETs formed from other material systems may benefit from the concepts disclosed herein.

The circuitry 16 further includes a first conditioning circuit 48 and a second conditioning circuit 50. The first conditioning circuit 48 is configured to receive the first pre-gate signal and provide a first gate signal to a gate of the first FET 44. The second conditioning circuit 50 is configured to receive the second pre-gate signal and provide a second gate signal to a gate of the second FET 46. Herein, an input signal IN at the input node 26 and provided to the first conditioning circuit 48 causes an output signal OUT at the output node 28 that is coupled to the drain of the second FET 46 (may not be directly coupled). In different applications, the input signal IN from the input node 26 may be provided to the second conditioning circuit 50 and cause the output signal OUT at the output node 28.

In one embodiment, the first conditioning circuit 48 includes a first bias circuit 52, which is configured to combine the first pre-gate signal from the dividing circuit 32 and the input signal IN from the input node 26, and provide the first gate signal to the gate of the first FET 44. One exemplary first bias circuit 52 includes a first capacitor 54 and a first inductor 56, where the first capacitor 54 is coupled between the gate of the first FET 44 and the input node 26 and the first inductor 56 is coupled between the gate of the first FET 44 and the dividing circuit 32. The first conditioning circuit 48 may also include a first load resistor 58 coupled between the input node 26 and the first capacitor 54. The input signal IN in series with the first load resistor 58 may form an equivalent circuit as a microwave power source to drive the stacked FET power amplifier 20.

The second conditioning circuit 50 includes a second bias circuit 60, which is configured to receive the second pre-gate signal from the averaging circuit 34 and provide the second gate signal to the gate of the second FET 46. One exemplary second bias circuit 60 includes a second capacitor 62 and a second inductor 64, where the second capacitor 62 is coupled between the gate of the second FET 46 and the fixed voltage node 30 and the second inductor 64 is coupled between the gate of the second FET 46 and the averaging circuit 34. The first conditioning circuit 48 may also include a second load resistor 66 coupled between the fixed voltage node 30 and the second capacitor 62.

The circuitry 16 may also include a third bias circuit 68 coupled between the supply node 22 and the drain of the second FET 46, and configured to receive a drain signal provided at the drain of the second FET 46 and provide the output signal OUT to the output node 28. One exemplary third bias circuit 68 includes a third capacitor 70 and a third inductor 72, where the third capacitor 70 is coupled between the drain of the second FET 46 and the output node 28 and the third inductor 72 is coupled between the drain of the second FET 46 and the supply node 22.

Notice that the drain signal provided at the drain of the second FET 46, the first gate signal provided at the gate of the first FET 44, and the second gate signal provided at the gate of the second FET 46 are derived from at least one of only the supply signal at supply node 22, the control signal at the control node 24, and the input signal IN at the input node 26.

Under transient conditions, some amount of gate currents are needed to charge or discharge the gate capacitances. The larger the gate currents, the faster the gate voltages change and the faster the first and second FETs 44 and 46 conduct. Since the supply signal has a much larger value than the control signal, the gate currents to the gates of the first and second FETs 44 and 46 are desired to be sourced by the supply signal rather than the control signal. As shown in FIG. 3, the first conditioning circuit 48 further includes a first shifting-buffer circuit 74 and a second shifting-buffer circuit 76 to cause a first gate current for the gate of the first FET 44 to be drawn from the supply signal. The second conditioning circuit 50 further includes a third shifting-buffer circuit 78 to cause a second gate current for the gate of the second FET 46 to be drawn from the supply signal.

The first shifting-buffer circuit 74 is coupled between the dividing circuit 32 and the first bias circuit 52. FIG. 4 shows that the first shifting-buffer circuit 74 includes a first level shifter 80 and a first voltage buffer 82. The first level shifter 80 is configured to receive the first pre-gate signal from the dividing circuit 32 and provide a first shifted pre-gate signal. The first voltage buffer 82 is configured to receive the first shifted pre-gate signal and provide a first buffered pre-gate signal to the first bias circuit 52. The first bias circuit 52 is configured to receive the first buffered pre-gate signal and provide a first gate signal to the gate of the first FET 44.

The first voltage buffer 82 may be formed by a first buffer FET 84, a first buffer resistor 86, and a second buffer resistor 88. A drain of the first buffer FET 84 is coupled to the second shifting-buffer circuit 76, a gate of the first buffer FET 84 is coupled to the first level shifter 80, and a source of the first buffer FET 84 is coupled to the first bias circuit 52. The first buffer resistor 86 is coupled between the source of the first buffer FET 84 and the control node 24, and the second buffer resistor 88 is coupled between the gate of the first buffer FET 84 and the control node 24. The first level shifter 80 may be formed by one or more diodes, which are coupled between the dividing circuit 32 and the gate of the first buffer FET 84.

The second shifting-buffer circuit 76 is coupled between the supply node 22 and the first shifting-buffer circuit 74 and configured to provide power to the first voltage buffer 82. FIG. 5 shows that the second shifting-buffer circuit 76 includes a second level shifter 90 and a second voltage buffer 92. The second level shifter 90 is configured to receive the supply signal and provide a shifted supply signal. The second voltage buffer 92 is configured to receive the shifted supply signal and provide a buffered supply signal to the first shifting-buffer circuit 74.

The second voltage buffer 92 may be formed by a second buffer FET 94, a third buffer resistor 96, and a fourth buffer resistor 98. A drain of the second buffer FET 94 is coupled to the supply node 22, a gate of the second buffer FET 94 is coupled to the second level shifter 90, and a source of the second buffer FET 94 is coupled to the first shifting-buffer circuit 74, and more specially to the drain of the first buffer FET 84. The third buffer resistor 96 is coupled between the source of the second buffer FET 94 and the fixed voltage node 30, and the fourth buffer resistor 98 is coupled between the gate of the second buffer FET 94 and the fixed voltage node 30. The second level shifter 90 may be formed by one or more diodes, which are coupled between the supply node 22 and the gate of the second buffer FET 94.

Herein, the second shifting-buffer circuit 76 is used to reduce the voltage seen at the drain of the first buffer FET 84 due to the large difference between the supply voltage $V_S$ and the control voltage $V_C$. The first voltage buffer 82 causes the first gate current provided by the first gate signal to be sourced by the supply signal and not the control signal. The first level shifter 80 is used to compensate non-unity gain of the first voltage buffer 82.

The third shifting-buffer circuit 78 is coupled between the averaging circuit 34 and the second bias circuit 60. FIG. 6 shows that the third shifting-buffer circuit 78 includes a third level shifter 100 and a third voltage buffer 102. The third level shifter 100 is configured to receive the second pre-gate signal from the averaging circuit 34 and provide a second shifted pre-gate signal. The third voltage buffer 102 is configured to receive the second shifted pre-gate signal and provide a second buffered pre-gate signal to the second bias circuit 60. The second bias circuit 60 is configured to receive the second buffered pre-gate signal and provide a second gate signal to the gate of the second FET 46.

The third voltage buffer 102 may be formed by a third buffer FET 104, a fifth buffer resistor 106, and a sixth buffer resistor 108. A drain of the third buffer FET 104 is coupled to the supply node 22, a gate of the third buffer FET 104 is coupled to the third level shifter 100, and a source of the third buffer FET 104 is coupled to the second bias circuit 60. The fifth buffer resistor 106 is coupled between the source of the third buffer FET 104 and the fixed voltage node 30, and the sixth buffer resistor 108 is coupled between the gate of the third buffer FET 104 and the fixed voltage node 30. The third level shifter 100 may be formed by one or more diodes, which are coupled between the averaging circuit 34 and the gate of the third buffer FET 104. The third voltage buffer 102 causes the second gate current provided by the second gate signal to be sourced by the supply signal and not the control signal. The third level shifter 100 is used to compensate non-unity gain of the third voltage buffer 102.

It is clear that the first conditioning circuit 48 and the second conditioning circuit 50 are powered by the supply signal from the supply node 22. The first gate current provided by the first gate signal to the gate of the first FET 44 is sourced by the supply signal and not the control signal, and the second gate current provided by the second gate signal to the gate of the second FET 46 is also sourced by the supply signal and not the control signal.

Those skilled in the art will recognize improvements and modifications to the preferred embodiments of the present disclosure. All such improvements and modifications are considered within the scope of the concepts disclosed herein and the claims that follow.

What is claimed is:

1. A circuitry comprising:
   a supply node, a control node, an input node, an output node, and a fixed voltage node;
   an auto-bias circuit comprising a dividing circuit and an averaging circuit, wherein:
   the dividing circuit is coupled between the control node and the fixed voltage node, and configured to provide a first pre-gate signal having a first pre-gate voltage that has a fractional relationship with a control voltage of a control signal applied at the control node; and
   the averaging circuit is coupled between the supply node and the control node, and configured to provide a second pre-gate signal having a second pre-gate voltage that has a fractional relationship with a sum of the control voltage and a supply voltage of a supply signal provided at the supply node;
   a stacked power amplifier coupled between the supply node and the fixed voltage node, and comprising a first field-effect transistor (FET) coupled in series with a second FET, wherein a drain of the first FET is coupled to a source of the second FET;
   a first conditioning circuit configured to receive the first pre-gate signal and provide a first gate signal to a gate of the first FET; and
   a second conditioning circuit configured to receive the second pre-gate signal and provide a second gate signal to a gate of the second FET, wherein an input signal that is from the input node and provided to at least one of the first conditioning circuit and the second conditioning circuit causes an output signal at the output node that is coupled to a drain of the second FET.

2. The circuitry of claim 1 wherein a drain signal that is provided at the drain of the second FET, the first gate signal, and the second gate signal are derived from at least one of only the supply signal, the control signal, and the input signal.

3. The circuitry of claim 1 wherein the first FET and the second FET are gallium nitride (GaN) FETs.

4. The circuitry of claim 1 wherein the averaging circuit comprises a first averaging resistor coupled in series with a second averaging resistor.

5. The circuitry of claim 4 wherein a value of the first averaging resistor is within two percent (2%) of a value of the second averaging resistor.

6. The circuitry of claim 1 wherein the dividing circuit comprises a first dividing resistor coupled in series with a second dividing resistor.

7. The circuitry of claim 6 wherein a value of the first dividing resistor is within two percent (2%) of a value of the second dividing resistor.

8. The circuitry of claim 1 wherein the averaging circuit comprises a first averaging resistor coupled in series with a second averaging resistor and the dividing circuitry comprises a first dividing resistor coupled in series with a second dividing resistor.

9. The circuitry of claim 8 wherein a value of the first averaging resistor is within two percent (2%) of a value of the second averaging resistor, within 2% of a value of the first dividing resistor, and within two percent (2%) of a value of the second dividing resistor.

10. The circuitry of claim 1 wherein the first conditioning circuit and the second conditioning circuit are powered by the supply signal.

11. The circuitry of claim 1 wherein a first gate current provided by the first gate signal to the gate of the first FET is sourced by the supply signal and not the control signal, and a second gate current provided by the second gate signal to the gate of the second FET is sourced by the supply signal and not the control signal.

12. The circuitry of claim 1 wherein the first conditioning circuit comprises a bias circuit configured to combine the first pre-gate signal and the input signal, and provide the first gate signal to the gate of the first FET.

13. The circuitry of claim 12 wherein the bias circuit comprises a capacitor and an inductor, wherein:
the capacitor is coupled between the gate of the first FET and the input node; and
the inductor is coupled between the gate of the first FET and the dividing circuit.

14. The circuitry of claim 1 wherein the first conditioning circuit comprises a first shifting-buffer circuit, and a bias circuit, wherein:
the first shifting-buffer circuit comprises a first level shifter and a first voltage buffer;
the first level shifter is configured to receive the first pre-gate signal, reduce the first pre-gate voltage, and provide a first shifted pre-gate signal;
the first voltage buffer is configured to receive the first shifted pre-gate signal and provide a first buffered pre-gate signal, wherein the first voltage buffer causes the first gate current provided by the first gate signal to be sourced by the supply signal and not the control signal; and the bias circuit is configured to combine the first buffered pre-gate signal and the input signal, and provide the first gate signal to the gate of the first FET.

15. The circuitry of claim 14 wherein the bias circuit comprises a capacitor and an inductor, wherein:
the capacitor is coupled between the gate of the first FET and the input node; and
the inductor is coupled between the gate of the first FET and the first voltage buffer.

16. The circuitry of claim 14 wherein the first level shifter is formed by at least one diode.

17. The circuitry of claim 14 wherein the first conditioning circuit further comprises a second shifting-buffer circuit coupled between the supply node and the first shifting-buffer circuit and configured to provide power to the first voltage buffer.

18. The circuitry of claim 1 wherein the second conditioning circuit comprises a bias circuit configured to receive the second pre-gate signal and provide the second gate signal to the gate of the second FET, wherein:
the bias circuit comprises a capacitor and an inductor;
the capacitor is coupled between the gate of the second FET and the fixed voltage node; and
the inductor is coupled between the gate of the second FET and the averaging circuit.

19. The circuitry of claim 1 wherein the second conditioning circuit comprises a shifting-buffer circuit and a bias circuit, wherein:
the shifting-buffer circuit comprises a level shifter and a voltage buffer;
the level shifter is configured to receive the second pre-gate signal, reduce the second pre-gate voltage, and provide a second shifted pre-gate signal;
the voltage buffer is configured to receive the second shifted pre-gate signal and provide a second buffered pre-gate signal, wherein the voltage buffer causes gate current provided by the second gate signal to be sourced by the supply signal and not the control signal; and
the bias circuit is configured to receive the second buffered pre-gate signal and provide the second gate signal to the gate of the second FET.

20. The circuitry of claim 19 wherein the bias circuit comprises a capacitor and an inductor, wherein:
the capacitor is coupled between the gate of the second FET and the fixed voltage node; and
the inductor is coupled between the gate of the second FET and the voltage buffer.

21. The circuitry of claim 19 wherein the level shifter is formed by at least one diode.

22. The circuitry of claim 1 further comprising a bias circuit coupled between the supply node and the drain of the second FET, and configured to receive a drain signal provided at the drain of the second FET and provide the output signal to the output node, wherein:
the bias circuit includes a capacitor and an inductor;
the capacitor is coupled between the drain of the second FET and the output node; and
the inductor is coupled between the drain of the second FET and the supply node.

* * * * *